(12) United States Patent
Pavier

(10) Patent No.: US 7,678,609 B2
(45) Date of Patent: Mar. 16, 2010

(54) SEMICONDUCTOR PACKAGE WITH REDISTRIBUTED PADS

(75) Inventor: Mark Pavier, Felbridge (GB)

(73) Assignee: International Rectifier Corporation, El Segundo, CA (US)

( * ) Notice: Subject to any disclaimer, the term of this patent is extended or adjusted under 35 U.S.C. 154(b) by 509 days.

(21) Appl. No.: 11/592,408

(22) Filed: Nov. 3, 2006

(65) Prior Publication Data

US 2007/0099343 A1    May 3, 2007

Related U.S. Application Data

(60) Provisional application No. 60/733,282, filed on Nov. 3, 2005.

(51) Int. Cl.
*H01L 21/44* (2006.01)
*H01L 21/48* (2006.01)
*H01L 21/50* (2006.01)

(52) U.S. Cl. ............ 438/106; 436/124; 436/127; 257/690; 257/700

(58) Field of Classification Search ......... 438/106, 438/124–127; 257/690, 700, 703, 704, E21.499
See application file for complete search history.

(56) References Cited

U.S. PATENT DOCUMENTS

| 6,166,430 | A  | * | 12/2000 | Yamaguchi | ............... | 257/666 |
| 7,034,385 | B2 | * | 4/2006  | Ambrus    | ............... | 257/678 |
| 7,037,808 | B2 | * | 5/2006  | Jiang et al. | ............ | 438/476 |
| 2002/0031902 | A1 | * | 3/2002 | Pendse et al. | ......... | 438/612 |
| 2002/0190366 | A1 | * | 12/2002 | Hung et al. | ............ | 257/684 |
| 2003/0080405 | A1 | * | 5/2003 | Suzuki | .................. | 257/690 |
| 2003/0136573 | A1 | * | 7/2003 | Miyaki et al. | ........... | 174/52.4 |

* cited by examiner

*Primary Examiner*—Phuc T Dang
(74) *Attorney, Agent, or Firm*—Farjami & Farjami LLP

(57) ABSTRACT

A method for fabricating a semiconductor package which includes coupling an electrode of a semiconductor device to a portion of a lead frame, overmolding at least a portion of the die, and then removing a portion of the die to obtain a desired thickness.

26 Claims, 3 Drawing Sheets

US 7,678,609 B2

SEMICONDUCTOR PACKAGE WITH REDISTRIBUTED PADS

RELATED APPLICATION

This application is based on and claims benefit of U.S. Provisional Application Ser. No. 60/733,282, filed on Nov. 3, 2005, entitled SURFACE MOUNT DUAL SIDED COOLED PACKAGE WITH REDISTRIBUTED PADS, to which a claim of priority is hereby made and the disclosure of which is incorporated by reference.

BACKGROUND AND SUMMARY OF THE INVENTION

The present invention relates to semiconductor packages and more specifically relates to a process for the low cost manufacture of semiconductor packages.

Prior art power semiconductor packages typically include a housing which is frequently much larger than the semiconductor die it encapsulates. Further, in many known semiconductor device packages, heat is taken out only from one side of the die, usually the bottom surface.

Moreover, as the semiconductor die are reduced in size the size of the electrodes of the die are reduced which may increase the likelihood of failure due to solder joint degradation caused by electromigration and the like phenomenon.

In a method according to the present invention the electrodes of a semiconductor device are redistributed to larger pads, which are then used for external connection. As a result, failures resulting from the reduction in the size of electrodes can be reduced.

A method of fabricating a semiconductor package according to the present invention includes electrically and mechanically coupling one electrode on a front surface of a semiconductor die to one portion of a lead frame with a conductive adhesive body, providing overmolding for the semiconductor die, and removing at least a portion of the semiconductor die from the back surface thereof to a desired thickness.

In one embodiment of the present invention the lead frame includes a recess in which the semiconductor die is at least partially received, and the back surface of the die is plated to include a metallic body serving as a connection lead to the back surface of the die. The lead frame portion so coupled to the electrode of the semiconductor then serves a redistributed pad or lead for the die. The lead may have a connection surface coplanar with the plated metallic body, whereby all connection surfaces are disposed on the same plane for ease of mounting onto a circuit board or the like.

In another embodiment of the present invention the lead frame may be a flat metallic web such as a thick copper plate, which includes at least one portion defined by a passivation body for coupling to the electrode of the semiconductor die. The portion so defined is then patterned (isolated from the remaining body of the plate) to serve as the redistributed pad or lead for the semiconductor die. Similar to the first embodiment, the back of the die can be provided through plating or the like process with a metallic body.

Other features and advantages of the present invention will become apparent from the following description of the invention which refers to the accompanying drawings.

DETAILED DESCRIPTION OF EMBODIMENTS OF THE INVENTION

Figure 1A:
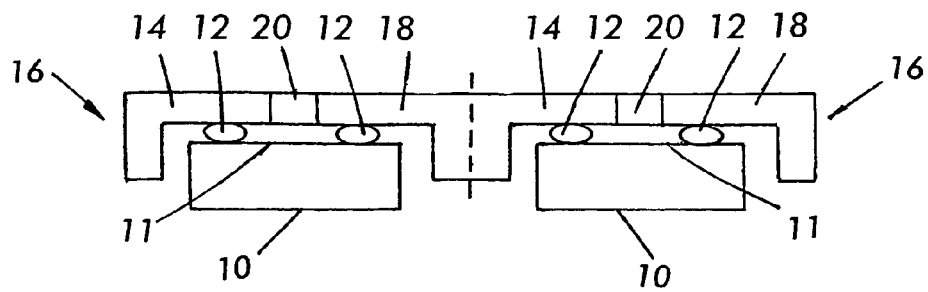
FIGS. 1A-1G illustrate a method according to the first embodiment of the present invention.
Figure 1B:
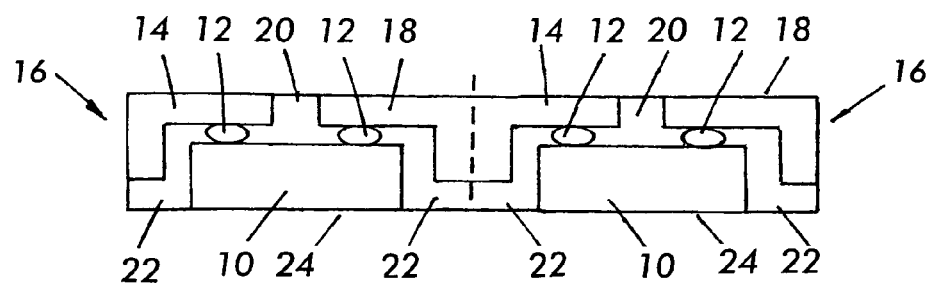
Figure 1C:
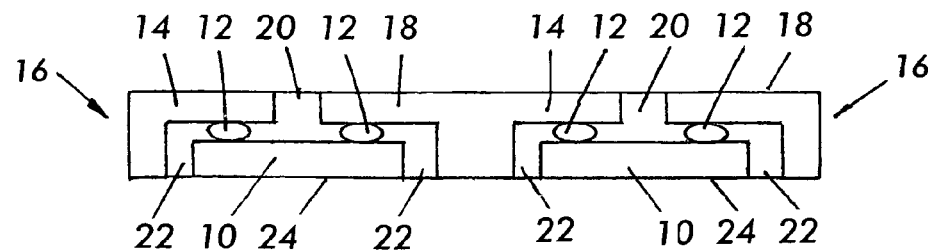

Referring to FIG. 1A, in a method of fabrication of a semiconductor package according to the first embodiment of the present invention at least one electrode (not shown specifically), e.g., power electrode of a power semiconductor device such as a power MOSFET, or the emitter electrode of an IGBT, on a front surface 11 of a semiconductor die 10 is electrically and mechanically coupled with a conductive adhesive body 12 (e.g. solder or conductive epoxy) to one portion 14 of a lead frame 16 (formed preferably from copper or a copper alloy). In the preferred embodiment, another electrode (not shown specifically), e.g. control electrode of a power semiconductor device such as the gate electrode of a power MOSFET or IGBT, on a front surface 11 of die 10 is electrically and mechanically coupled to another portion 18 of lead frame 16 with another conductive adhesive body 12 (e.g. solder or conductive epoxy). Note that portion 14 and portion 18 of lead frame 16 are electrically isolated from one another by a gap 20. Further note that in a preferred method a plurality of lead frames 16 are linked together to form a lead frame matrix so that a plurality of semiconductor packages can be fabricated together. Referring next to FIG. 1B, mold compound 22 or a suitable encapsulant is provided to fill the recess in lead frame 16 and to overmold preferably all exposed surfaces of die 10, except for back surface 24 thereof. Next, die 10, mold compound 22 and lead frame 16 are reduced in thickness through, for example, grinding, resulting in the arrangement illustrated by FIG. 1C.

Figure 1D:
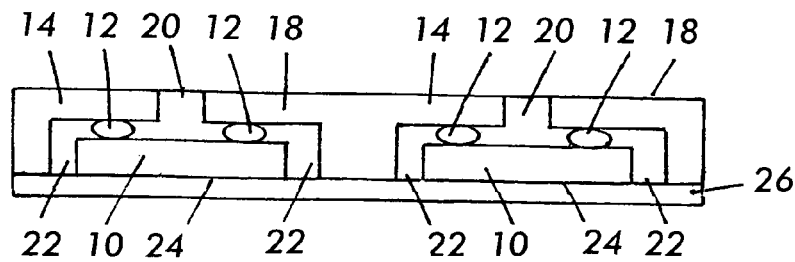

Referring next to FIG. 1D, a seed layer 26 of metallic material, e.g. copper, is formed by sputtering or the like on back surface 24 of die 10. Seed layer 26 preferably extends over portions of mold compound 22 and lead frame portion 14, 18 that are coplanar with back surface 24.

Figure 1E:
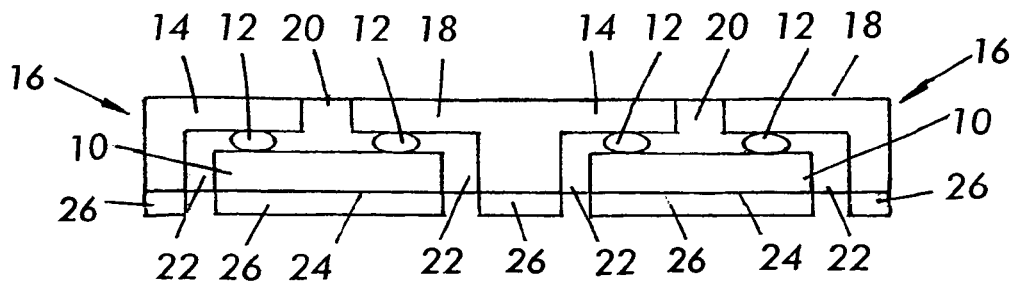
Figure 1F:
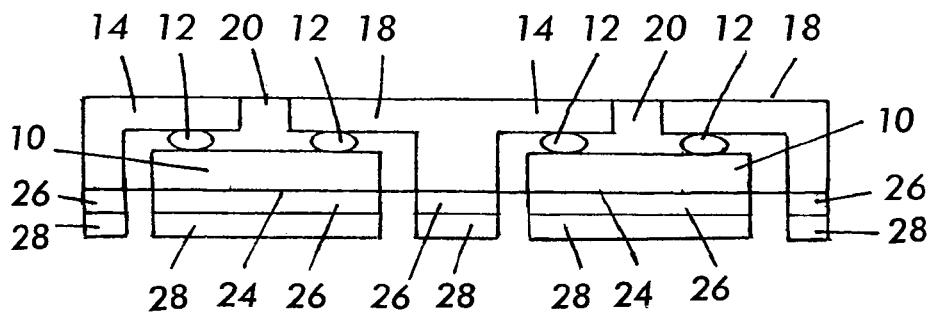
Figure 1G:
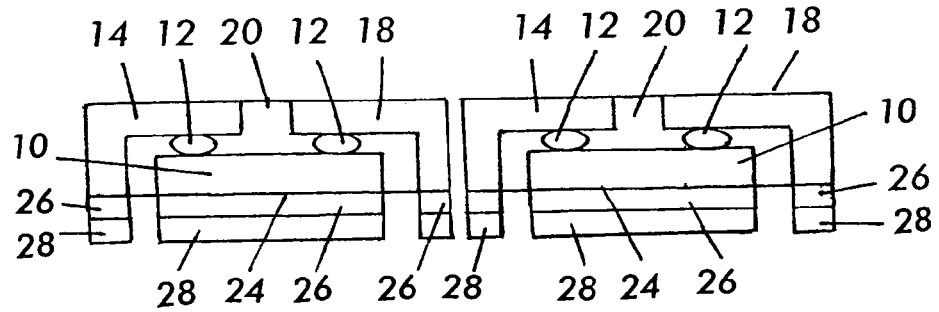

Referring next to FIG. 1E, through a masking and etching process selected portions of seed layer 26 are removed, leaving portions of seed layer 26 over back surface 24 and portions of lead frame 14, 18 that are coplanar with back surface 24 of die 10. Thereafter, through a plating process (e.g. electroless plating or electro plating) a thick metallic body 28 (e.g. copper) is grown over seed layer 26 to obtain a plurality of semiconductor packages as shown by FIG. 1F, and then the semiconductor packages are singulated from the lead frame matrix as illustrated by FIG. 1G to obtain individual semiconductor packages. Note that to render metallic body 28 solderable it can be coated with a solderable finish (e.g. electroless Ni/Au or electroless Ni/Ag) prior to the singulating step.

In a method according to the first embodiment of the present invention lead frame 16 includes a recess which at least partially receives die 10.

Figure 2A:
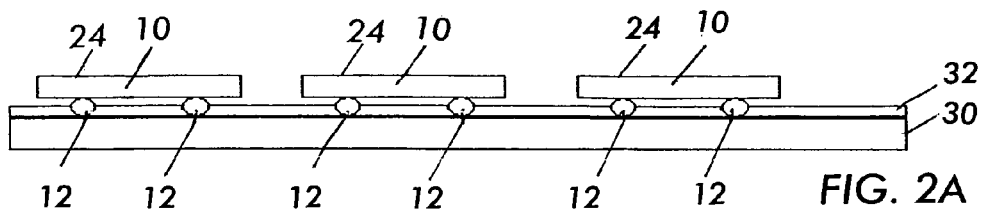
FIGS. 2A-2E illustrate a method according to the second embodiment of the present invention.

Referring next to FIG. 2A, in a method according to the second embodiment of the present invention, a flat copper web 30 (e.g. a thick copper plate) is provided with a passivation body 32 on one surface thereof which has been patterned to receive a plurality of semiconductor die 10. Specifically, an electrode of a die 10 can be electrically and mechanically coupled to web 30 with a conductive adhesive body 12 (e.g.

solder or conductive epoxy) through a corresponding opening in passivation 32. Thus, for example, a power electrode of a power semiconductor device such as the source electrode of a power MOSFET, or the emitter electrode of an IGBT, can be coupled to web 30. Similarly, the control electrode of the power semiconductor device, e.g. the gate electrode of the power MOSFET or the IGBT, can be coupled to web 30 through a respective opening in passivation 32.

Figure 2B:
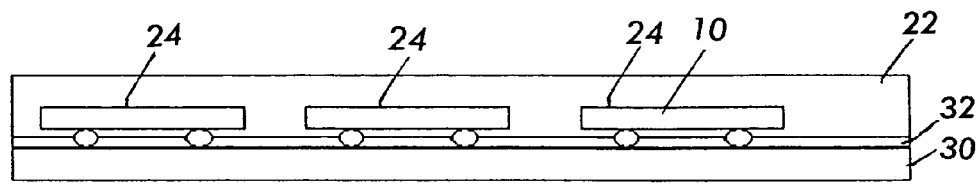
Figure 2C:
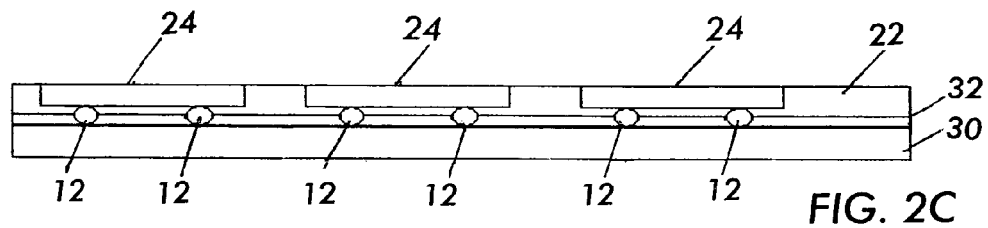

Referring next to FIG. 2B, mold compound 22 or a suitable encapsulant is applied over die 10, overmolding the exposed surfaces thereof. Next, a portion of die 10 is removed from the back surface 24 thereof through grinding or the like process. Note that naturally some of mold compound 22 will also be removed in the process resulting in the arrangement shown by FIG. 2C.

Figure 2D:
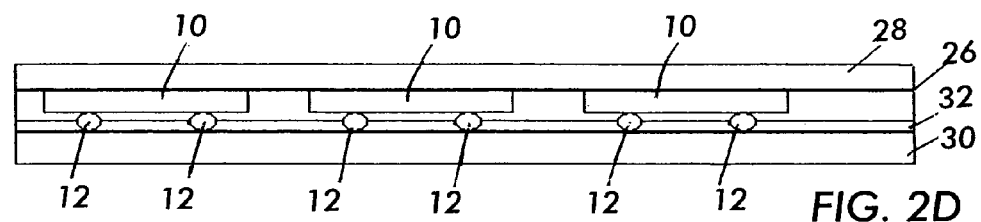
Figure 2E:
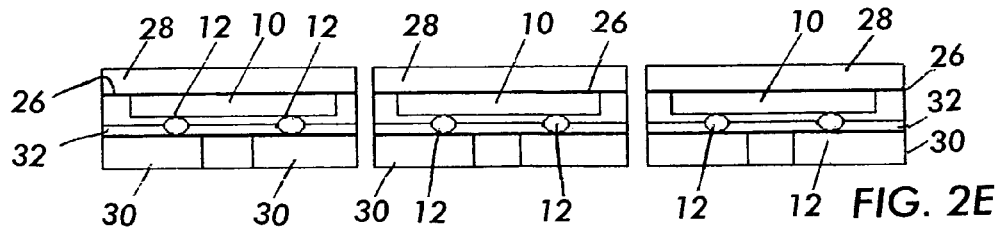

Thereafter, seed layer 26 (e.g. copper seed layer) is applied to the back surface 24 of die 10, and a metallic body 28 (e.g. copper body) is grown over seed layer 26 as illustrated by FIG. 2D. Next, through a masking and etching process web 30 is patterned whereby the portion thereof coupled to the power electrode is electrically isolated from the portion coupled to the control electrode of die 10. Web 30 is then singulated to obtain a plurality of semiconductor packages as shown by FIG. 2E.

To further enhance each package that is fabricated according to the second embodiment, a conductive clip can be electrically and mechanically coupled to metallic body 28 by a conductive adhesive body (e.g. solder or conductive epoxy).

Figures 3, 4:
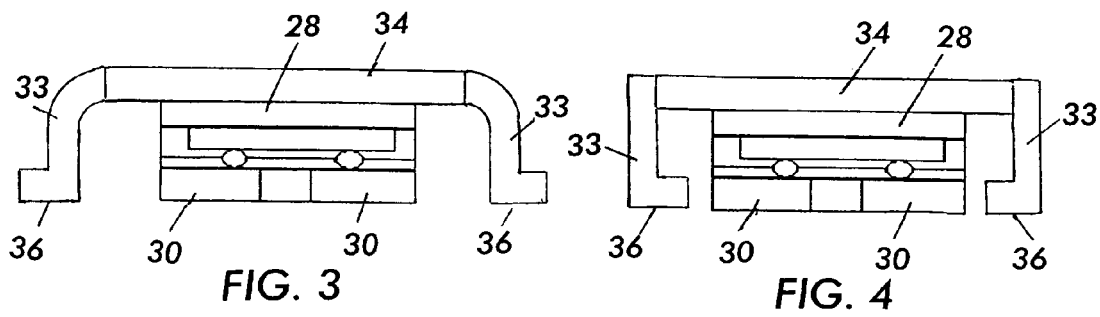
FIG. 3 illustrates an enhanced package that includes a package fabricated in a method according to the second embodiment.
FIG. 4 illustrates an alternative design to the enhanced package shown by FIG. 3.

For example, referring to FIG. 3, a clip 34 having a lead 33 extending outwardly (away from die 10) and a connection surface 36 that is generally coplanar with lead frame portions coupled to the power electrode and the control electrode of die 10 can be coupled to metallic body 28 of a package fabricated according to the present invention. Note that clip 34 may be cup-shaped as shown in U.S. Pat. No. 6,624,522, assigned to the assignee of the present invention.

Referring to FIG. 4, in an alternative design lead 33 may extend inwardly (toward die 10).

The present invention should not be understood to be limited to silicon-based semiconductor devices. Other semiconductor devices such as III-nitride based semiconductor devices can be used without deviating from the scope and spirit of the present invention.

In addition, the present invention is not limited to one semiconductor die per package. Rather, multiple die may be thermally and mechanically coupled to the lead frame in the manner described above before overmolding and other steps are carried out to obtain a package that includes more than one die.

Although the present invention has been described in relation to particular embodiments thereof, many other variations and modifications and other uses will become apparent to those skilled in the art. It is preferred, therefore, that the present invention be limited not by the specific disclosure herein, but only by the appended claims.

What is claimed is:

1. A method of fabricating a semiconductor package, comprising:
   electrically and mechanically coupling one electrode on a front surface of a semiconductor die to one portion of a lead frame with a conductive adhesive body;
   providing overmolding for said semiconductor die; and
   removing a portion of said semiconductor die from the back surface thereof to a desired thickness;
   wherein a portion of said overmolding is removed during said removing said portion of said semiconductor die.

2. The method of claim 1, wherein said lead frame includes a recess in which said semiconductor die is at least partially received.

3. The method of claim 1, further comprising electrically and mechanically coupling another electrode of said semiconductor die to another portion of said lead frame with another conductive adhesive body, said another portion of said lead frame being electrically isolated from said one portion of said lead frame.

4. The method of claim 3, wherein said one electrode is a control electrode and said another electrode is a power electrode of a power semiconductor die.

5. The method of claim 4, wherein said power semiconductor die is one of a power MOSFET and an IGBT.

6. The method of claim 1, further comprising forming a metallic body on said back surface of said semiconductor die.

7. The method of claim 6, wherein said metallic body is formed by growing a seed layer on said back surface of said die following by a plating step.

8. The method of claim 7, wherein said metallic body is comprised of copper.

9. The method of claim 1, further comprising growing a metallic body on said back surface of said semiconductor die and a spaced and electrically isolated metallic body on a portion of said lead frame coplanar with said back surface of said die.

10. The method of claim 9, wherein said metallic body and said spaced and electrically isolated metallic body are formed by forming a seed layer on said back surface, coplanar portion of said overmolding, and said coplanar portion of said lead frame; etching away selected portion of said seed layer to provide isolation between said seed layer on said back surface and seed layer on said coplanar portion of said lead frame; and plating said seed layer.

11. The method of claim 1, wherein said lead frame is a flat web.

12. The method of claim 1, wherein said lead frame, is a flat web body having a passivation body disposed on one surface thereof; said passivation body including at least one opening therein to receive at least partially said conductive adhesive.

13. The method of claim 12, wherein said passivation body includes at least another opening therein, and further comprising electrically and mechanically coupling another electrode of said power semiconductor die to said lead frame with a conductive adhesive body received at least partially in said another opening.

14. The method of claim 1, further comprising forming a metallic body on said back surface of said semiconductor die.

15. The method of claim 6, wherein said metallic body is formed by growing a seed layer on said back surface of said die followed by a plating step.

16. The method of claim 7, wherein said metallic body is comprised of copper.

17. The method of claim 14, further comprising electrically and mechanically coupling said metallic body to a conductive clip with a conductive adhesive.

18. The method of claim 17, wherein said clip includes a lead portion having a connection surface that is coplanar with lead frame.

19. The method of claim 18, wherein said clip is cup-shaped.

20. The method of claim 18, wherein said lead portion is bent inwardly toward said die.

21. The method of claim 18, wherein said lead portion is bent outwardly away from said die.

22. The method of claim 1, further comprising rendering said metallic body solderable with a solderable finish.

23. The method of claim 22, wherein said solderable finish is comprised of Ni/Au.

24. The method of claim 22, wherein said solderable finish is comprised of Ni/Ag.

25. The method of claim 1, wherein said semiconductor die is a III-nitride semiconductor device.

26. The method of claim 1, further comprising electrically and mechanically coupling one electrode of another die to said one portion of said lead frame.

* * * * *